(12) United States Patent
Gentile et al.

(10) Patent No.: US 7,489,053 B2
(45) Date of Patent: Feb. 10, 2009

(54) ELECTRONIC SWITCH SYSTEM WITH CONTINUOUS DESIGN

(75) Inventors: John Gentile, Montclair, NJ (US);
Anthony Gentile, New York, NY (US);
Terrance Z. Kaiserman, Loxahatchee, FL (US)

(73) Assignee: T-ink, LLC, New York, NY (US)

( * ) Notice: Subject to any disclaimer, the term of this patent is extended or adjusted under 35 U.S.C. 154(b) by 0 days.

(21) Appl. No.: 10/824,301

(22) Filed: Apr. 14, 2004

(65) Prior Publication Data
US 2005/0231879 A1    Oct. 20, 2005

(51) Int. Cl.
*H01H 3/00*    (2006.01)
(52) U.S. Cl. .................................. 307/139; 307/147
(58) Field of Classification Search ............... 307/112, 307/139
See application file for complete search history.

(56) References Cited

U.S. PATENT DOCUMENTS

| | | | |
|---|---|---|---|
| 4,363,081 A * | 12/1982 | Wilbur | 362/98 |
| 4,845,323 A * | 7/1989 | Beggs | 200/85 R |
| 5,278,734 A | 1/1994 | Ferber | |
| 5,455,749 A | 10/1995 | Ferber | |
| 5,567,037 A * | 10/1996 | Ferber | 362/104 |
| 5,626,948 A * | 5/1997 | Ferber et al. | 428/195.1 |
| 5,973,420 A * | 10/1999 | Kaiserman et al. | 307/139 |
| 6,188,506 B1 | 2/2001 | Kaiserman et al. | |
| 6,311,350 B1 | 11/2001 | Kaiserman et al. | |
| 6,641,860 B1 | 11/2003 | Kaiserman et al. | |
| 6,862,473 B2 * | 3/2005 | Keusch et al. | 604/20 |

* cited by examiner

Primary Examiner—Robert L. Deberadinis
(74) Attorney, Agent, or Firm—Lerner, David, Littenberg, Krumholz & Mentlik, LLP

(57) ABSTRACT

An electronic switch system comprising a circuit path that includes a first path that is formed by a substantially nonconductive composition and a second path that includes a nonconductive composition. The first and second paths are dispersed relative to each other to provide a continuous design circuit path having trigger points or open circuit areas.

16 Claims, 3 Drawing Sheets

ELECTRONIC SWITCH SYSTEM WITH CONTINUOUS DESIGN

BACKGROUND

The present invention relates to conductive compositions for use in connection with electronic systems and, in particular, the use of such compositions to provide continuous designs on a variety of objects.

Conductive compositions have been developed for various purposes including facilitating electrostatic discharge and as a current transfer medium on printed circuit boards. Conductive compositions have also been used, instead of conventional conductive wires, as a means for conducting current from a power source to one or more current operated modules on a variety of objects such as wearing apparel, toys posters, books and numerous other electronic devices.

U.S. Pat. No. 5,455,749 to Ferber ("the '749 patent"), owned by the assignee of the present invention and which is incorporated by reference herein in its entirety, discloses examples of desirable electrical systems that use conductive compositions. The '749 patent discloses electrical systems which include a power supply, one or more current operated modules and conductive compositions for use in connecting the power supply to a current operated module. In one embodiment of the '749 patent, the conductive composition may be colored and may form at least a portion of a design on the surface of a substrate.

U.S. Pat. No. 5,626,948 to Ferber et al. ("the '948 patent"), which is also owned by the assignee of the present invention and which is incorporated by reference herein in its entirety, discloses an electrical system having a multi-layer conductive composition. In accordance with the '948 patent, when pressure is applied to the top layer composition, a closed circuit condition occurs causing current to flow from the second layer composition vertically up through the top layer composition.

U.S. Pat. No. 5,973,420 to Kaiserman et al. ("the '420 patent"), which is also owned by the assignee of the present invention and which is incorporated herein by reference in its entirety, discloses an electrical system having a clear conductive composition. In accordance with the '420 patent, a clear conductive composition is arranged on a substrate and provides an electrical circuit path between a power source and a responsive circuit element. A trigger point is included within the circuit path by providing an open circuit area in the clear conductive composition. Upon placement of a conductive object across the open circuit area a closed circuit condition is created whereby current flows to the responsive circuit element.

In some applications it is desirable to mask the open circuit area from the user. For example, where conductive compositions are used to provide a design on a sheet that is meant to be colored by a child, if the child is able to immediately recognize the open circuit area the child may more easily focus on closing the circuit instead of coloring the design. In addition, where the electrical circuit path forms, for example, circuitry for a light switch or alarm system, a user may want to mask the location of the open circuit area for security reasons. Of utility then are methods and systems that can mask open circuit areas that are formed on circuit paths or make such open circuit areas appear as integral parts of the circuit path.

SUMMARY

One aspect of the present invention relates to a product comprising a first path formed by a substantially nonconductive composition and a second path formed by a substantially conductive composition. The second path is disposed on the first path so as to include at least one open area along the second path. Further in accordance with this aspect of the present invention, the product also includes an electronic circuit element coupled to the path. The electronic circuit element may be energized by a source through the second path by closing the at least one open area.

In accordance with this aspect of the present invention, the resistivity of the conductive composition is preferably less than or equal to 5 k$\Omega$/mm$^2$.

In accordance with an aspect of the invention, it is also preferable that the resistance of the conductive composition or second path be less than or equal to 25 M$\Omega$. The resistance of the nonconductive composition or first path may preferably be greater than or equal to 100 M$\Omega$. Most preferably, the resistance of the nonconductive composition is greater than or equal to 200 M$\Omega$.

Most preferably, the difference in resistance of the first path relative to the second path is greater than or equal to 1 k$\Omega$.

Further in accordance with this aspect of the present invention, the first path has a width that is greater than the width of the second path.

In additional embodiments in accordance with this aspect of the present invention, the first path may comprise a width that is less than or equal to the second path.

Most preferably, the circuit path has a width of approximately 1 mm.

Most preferably, the conductive and non-conductive compositions each comprise ink.

Further in accordance with this aspect of the present invention, the conductive composition may preferably include at least 20-80% of silver in an embodiment. The conductive composition may include 10-40% of carbon in another embodiment. Alternatively, the conductive composition may also desirably include 10-40% of graphite in another embodiment. In addition, other conductors, including but not limited to conductive polymers, indium, antimony tin oxide, carbon nano-tubes and other nano-structures, in any color, may also be used.

In a further preferred embodiment, the source comprises a battery. The electronic circuit element is then connected to the battery through the second path when a conductive element is connected across the at least one open area. The electronic circuit element may include an LED, sound module or other circuit element that generates a response when the element is connected across the at least one gap.

In accordance with another aspect of the present invention, an electrical switching system is provided. The system preferably comprises a first path formed by a nonconductive composition and a second path formed by a substantially conductive composition. The second path desirably includes at least one gap defined by first and second ends of the second path and that form an open circuit area along the second path. The first path is preferably disposed between the first and second ends so as to mask the appearance of the at least one gap. Further in accordance with this aspect of the present invention, the electronic switching system further preferably includes at least one circuit module that is coupled to the second path. The at least one circuit module is operable when a close circuit condition is caused across said at least one gap.

In accordance with this aspect of the present invention, the resistivity of the conductive composition is preferably less than or equal to 5 k$\Omega$/mm$^2$. In addition, it is also preferable that the resistance of the conductive composition that forms a portion of a design be less than or equal to 25 M$\Omega$ and the resistance of the nonconductive composition that forms a portion of the design can be greater than or equal to 100 M$\Omega$. Most preferably, the resistance of the nonconductive composition is greater than or equal to 200 M$\Omega$.

Further in accordance with this aspect of the present invention, the system further includes a battery that is coupled to the second path. The battery causes a current to flow across the at least one circuit module when the closed circuit condition exists. Exemplary circuit modules may include an LED and/or sound generating electronic component.

In yet another aspect of the present invention, a product is provided. The product comprises an object and a circuit path that is disposed on the object. The circuit path includes a first layer formed by a conductive composition.

The first layer is disposed adjacent to a second layer formed by a substantially conductive composition.

In accordance with this aspect of the present invention, it is preferable that the object comprises paper. In other embodiments, the object may comprise apparel or other items. In addition and in general, the object may include any substrate onto which a circuit path may be formed.

Further in accordance with this aspect of the present invention, the product may further comprise a responsive circuit element disposed on the object and coupled to the circuit path.

Most preferably, the circuit path includes at least one gap formed within the first layer of a conductive ink composition. The gap forms an open circuit condition along the circuit path, which when closed causes a close circuit condition, which allows a responsive circuit element to be energized by a power source.

In accordance with an alternative, the first layer is disposed between the one or more gaps disposed along the second layer so as to mask the one or more gaps.

The product may also further desirably comprise a battery coupled to the second layer, wherein said battery causes a current to flow across an electronic component when one or more conductive elements are placed said across said one or more gaps.

In accordance with another aspect of the present invention, an electronic product is provided. The product preferably comprises a substrate, a battery and a substantially non-conductive composition arranged on the substrate and having a first color. In accordance with this aspect of the present invention, a substantial conductive composition having a second color that matches the first color is preferably arranged on the non-conductive composition so as to form an open circuit area thereon. Further in accordance with this aspect of the present invention, an electronic circuit element is connected to the conductive composition such that the electronic circuit element is preferably electronically connected to the battery through the conductive composition of enclosing of the open circuit area.

Further in accordance with this aspect of the present invention, the non-conductive composition forms a first path having a first width and a conductive composition forms second path having a second width. Desirably, the first width is at least as wide as the second width.

Further still, the first path may have a width approximately 1 milli-meter. It may also prove desirable if the conductive and non-conductive composition comprise ink.

Further in accordance with this aspect of the present invention, the conductive composition may desirably including predetermined amount of silver or, in other embodiments, comprises a predetermined amount of carbon.

In yet still another aspect of the present invention, an electronic product comprising a substrate; a non-conductive composition arranged on the substrate; and a conductive composition arranged on a portion of the non-conductive composition is provided. Preferably, the conductive composition forms against for which the non-conductive composition is visible, the conductive and non-conductive composition having substantially the same color so that the combination of the two compositions appear to be continuous across the gap.

Further in accordance with this aspect of the present invention, a circuit module may be connected to the conductive composition and a battery electrically connecting to the conductive composition such that circuit module is operable when a closed circuit condition is caused by placing a conductive object across the gap of the conductive composition.

An yet another aspect the present invention includes an electronic product comprising a substrate; a battery; a layer of substantially non-conductive ink having a predetermined color printed on the substrate; and a layer of conductive ink having substantially the same color as the non-conductive ink, the conductive ink being arranged on top the portion of the non-conductive ink and being connected to the battery, the conductive ink form at least one open circuit switch area that can be selectively closed upon contact with a conductive element.

Further in accordance with this aspect of the present invention, the non-conductive ink is preferably arranged across the at least one open circuit switch area so that the at least one open circuit switch has a continuous visual appearance.

Further in accordance with this aspect of the present invention, the electronic product made desirably further comprises an electronic circuit element connected for electrical communication with the conductive ink and the battery.

Further still in accordance with this aspect of the present invention, the electronic circuit element may comprise a light emitting diode or a sound module.

DETAILED DESCRIPTION

Figure 1:
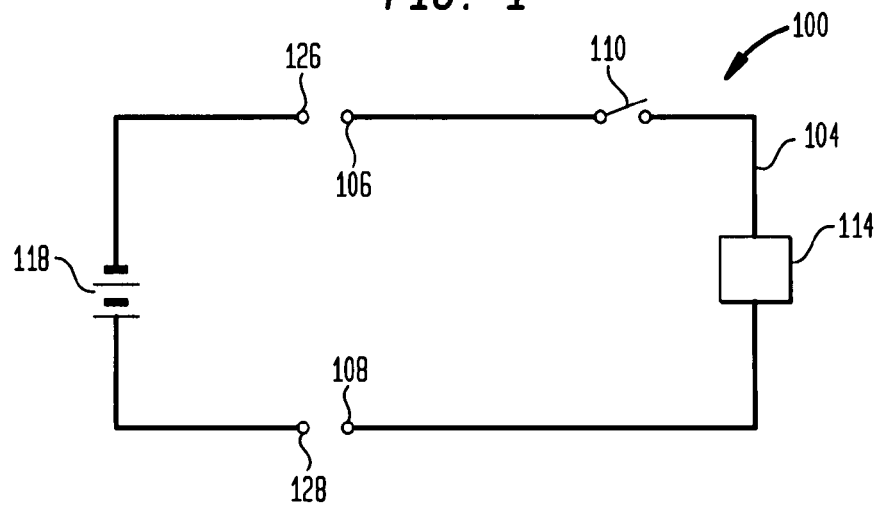
FIG. 1 is an illustrative schematic circuit diagram of a system in accordance with an aspect of the present invention.

With reference to FIG. 1, there is illustrated a schematic circuit diagram of an electronic switch system 100 in accordance with an aspect of the present invention. The system 100 includes a circuit path 104 that extends between a first node 106 and a second node 108. A switch 110 and a responsive circuit element 114 are connected in series along the circuit path 104. As shown, the first and second nodes 104 and 106 are connectable to a voltage supply 118 at terminal points 126 and 128. In operation, if the voltage supply 118 is connected to the path 104 via terminal points 126, 128 and nodes 106, 108 and the switch 110 is closed, a closed circuit condition occurs and the responsive circuit element 114 draws a current and is energized. The responsive circuit element 114 may include any number of light illuminating and sound assemblies. For example, in some applications the responsive circuit element 114 may comprise an LED and/or sound module embodied in a microchip or similar integrated circuitry or, in general, any electronic component. Thus, where the responsive circuit element comprises a sound module, the closed circuit condition results in a tune being played or sound emanating from a speaker. In general, the responsive circuit elements may be used to provide sound, light, heat or various other visual, audio and functional effects. Various exemplary applications in accordance with the present invention include those described in the '420, '948 and '749 patents, the disclosures of which are incorporated by reference herein in their entirety.

Figure 2:
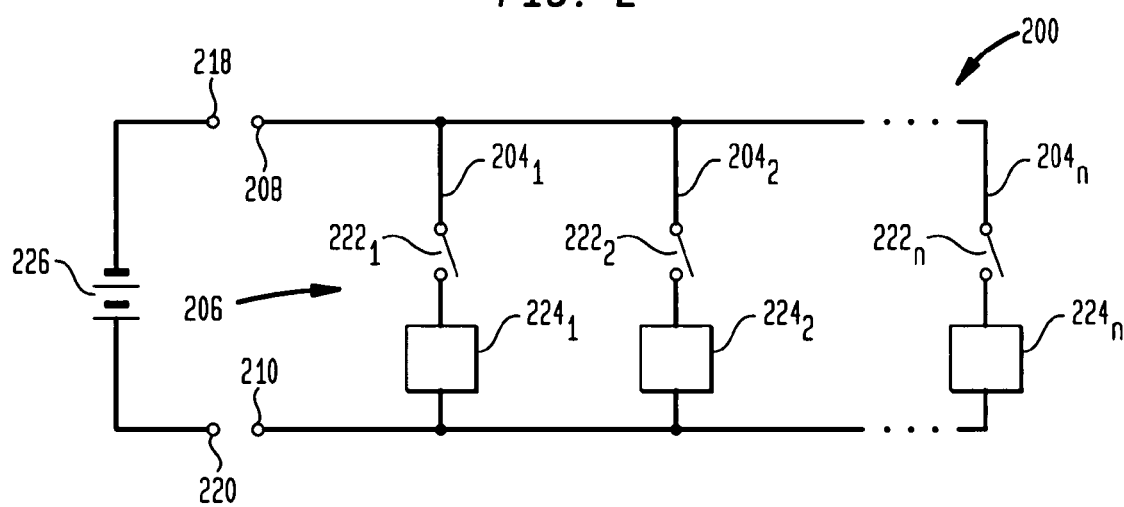
FIG. 2 is an illustrative schematic circuit diagram of the system in accordance with another aspect of the present invention.

FIG. 2 illustrates a schematic diagram of another electronic switch system 200 in accordance with one aspect of the present invention. As shown, system 200 may include a plurality of circuit paths $204_1$, $204_2$ through $204_n$ that are connected in parallel on a network 206 of circuit paths between first and second nodes 208 and 210, respectively. The nodes 208 and 210 are connectable to the terminals 218, 220 of voltage supply 226. Each branch 204 includes a switch 222 and a responsive circuit element $224_1$, $224_2$ through $224_n$. As with voltage supply 118, the voltage supply 226 is shown as a DC voltage source. However, depending on the application, voltage supply 226 or 118 may also be an AC voltage supply.

In operating system 200, voltage supply 226 is connected to network 206 at terminal points 218, 220 via nodes 208, 210. For each switch 222 that is closed, the corresponding responsive circuit element 224 is energized and operates accordingly. As discussed above, the responsive circuit elements $224_1$-$224_n$ may produce any number of visual, audio or other desirable functional effects. For example, in some instances it may be desirable to produce an aroma, e.g., perfume odor, from a particular responsive circuit element (114 or 224) that is energized.

As with system 100, system 200 may be employed in any number of applications. As is discussed in greater detail below, systems 100 and 200 may be implemented on a sheet of paper that interacts with a user as particular switches are closed. Other objects on which the present invention may be applied or embodied include apparel, toys, furniture, walls, automobile dashboards, etc.

Figure 3A:
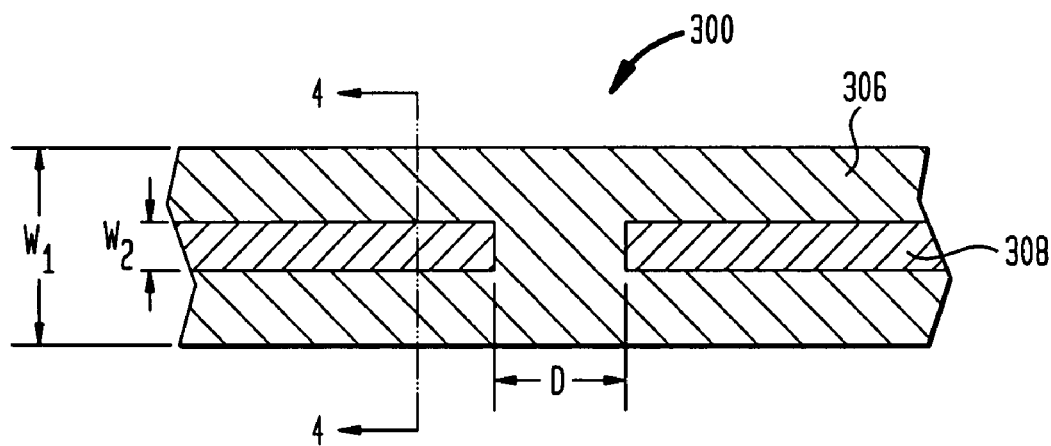
FIG. 3A is an illustrative enlarged top view of a portion of the circuit path in accordance with an aspect of the present invention.

With reference to FIG. 3A, there is depicted a top view of multi-layer composition 300 that may comprise a circuit path in accordance with the present invention. As shown, the multi-layer composition 300 preferably includes first layer 306 and second layer 308. Second layer 308 is preferably disposed or deposited on first layer 306. In addition, the width $W_1$ of first layer 306 is preferably larger than the width $W_2$ of second layer 308. In a preferred embodiment, the width of the line that comprises the first layer of composition 306, e.g., $W_1$, is approximately 1 mm. In addition, line widths greater than 1 mm may also form the first composition layer. Smaller line widths, such as approximately 0.5 mm, are also allowable, as well as line widths on the order of nanometers ($10^{-9}$ meters).

In accordance with one aspect of the present invention, first layer 306 comprises a substantially nonconductive composition, which is unable to conduct electricity. First layer 306 may also comprise a semiconductor or any conductor of higher resistance than second layer 308. Available materials or substances that may comprise first layer 306 preferably include any materials that have a resistance greater than or equal to 200 MΩs. Thus, each branch (e.g., 104 or 204) of a circuit path constructed in accordance with one aspect of the present invention includes first layer 306 that includes a resistance of 200 MΩs or greater. In addition, in some circumstances the resistance of the nonconductive composition may be greater than or equal to 100 MΩs.

First layer 306 preferably comprises ink that is applied onto the surface of an object in a continuous design. Nonetheless, the ink comprising first layer 306 may also be applied in a discontinuous design similar to halftones with the printing process spreading the lines to make them continuous. In addition, nonconductive materials in the form of liquids, pastes, powders, fibers or granules that are modified so that they can be relatively easily painted, applied, screened, coated, molded or otherwise deposited on a substrate, integrally with apparel, objects or things, and connected by various known techniques to become fixed to such substrate, apparel, objects or things may be used in accordance with the present invention. As a general matter, the present invention may be applied to any substrate or base, in addition to those objects mentioned throughout the specification.

Second layer 308 comprises a substantially conductive composition and may include any number of electrically conductive materials. Second layer 308 preferably includes between about 5% to 80% conductive material by weight. Second layer 308 may also include 0.5% conductive material by weight using nanotubes. Most preferably, the second layer includes between about 30% and 65% of the conductive material by weight. The desirable range depends upon the conductive material selected and on other ingredients in the system. A wide range of conductive materials may be used. It is preferable for the conductive materials of second layer 308 to provide a relatively high level of conductivity (i.e., a relatively low level of resistivity which may be in the range of approximately 5MΩ/mm² or less). The resistance of the second layer 308 is generally no more than 1000 MΩ and more preferably no more than approximately 300 MΩ. It should be appreciated that the aforementioned ranges of conductivity/resistivity and the percentage of conductive material in the second composition layer is provided as an example of preferred ranges. Thus, conductivity/resistivity levels above or below the aforementioned ranges may be obtained while remaining within the scope of the present invention. In addition, the ranges of impedance between layers and between positive and negative circuits can be adjusted to allow for current to flow only along the desired conductive path. As such, as long as the resistance of one path is high relative to the other path, current will flow along the other path only. Specifically, as long as the difference in resistance between the first layer 306 and second layer 308 is equal to or greater than approximately 1 kΩ, the electronics may be tailored to read the layer having the lower resistance. Conversely, the layer having the greater resistance value may be read without regard to the lower resistance layer. Further in this regard, as the resistance of a conductor is known to be directly proportional to its length, the resistance value measured along the circuit path will depend on the length of the path. As such, the resistance of each path or layer comprising a circuit path 106 or 204 (with the switch closed) will change depending on the measurement location. In addition, each circuit path among a plurality of paths (e.g., $204_1$ through $204_n$) may be implemented with a different resistance value.

The conductive materials are preferably consistent with the desired additional properties of the second composition 308 layer including its washability, flexibility, and other desired properties. The conductive materials may be, but are not limited to, precious metals and non-precious metals such as base metal powders and flakes, inorganic powders coated with precious or base metals, graphite and elemental carbon powders, and various inorganic powders such as mica, $TiO_2$, silica, etc., coated with antimony doped tin oxide. Such powders need not be spherical or flake-like. For example, silver coated fiberglass particles can be used. Suitable non-precious metals include iron, copper, brass, bronze, aluminum and nickel as well as non-precious metal coated non-conducting particles. Other suitable non-precious conductive materials include materials marketed by E.I. DuPont de Nemours under the trademarks ZELEC 1410M (antimony doped tin oxide on mica particles), and ZELEC 1610S (antimony doped tin oxide on silica particles) and GRAPHITE 850 from Asbury Graphite. Various conductive polymers, doped polyacetylene, doped polypyrrole, doped polyaniline and the like may also be used. It should be appreciated that other conductive materials besides those discussed herein may be used while remaining within the scope of the present invention.

Further in accordance with this aspect of the present invention, the conductive composition may preferably include at least 20-80% of silver in an embodiment and/or 10-40% of carbon in another embodiment. Alternatively, the conductive composition may also desirably include 10-40% of graphite in another embodiment. In addition, other conductors, including polymers, indium, single wall and multi-wall carbon nano-tubes and other nano-structures, as well as all other known conductors, in any color, composition, and shape and/or particle size may also be used.

Second composition layer 308 of the multi-layered conductive composition may contain between about 5%-60% resin by weight. More preferably, second composition layer 308 may contain between 15% and 35% of resin by weight. However, it should be appreciated that resin amounts greater or less than the ranges discussed herein may be used while remaining within the scope of the present invention.

The resins may be any of the resins typically used for surface coatings. To this end, examples of suitable resins include acrylamide, acrylics, phenolics, bisphenol A type epoxy, shellac, carboxymethyl cellulose, cellulose acetate butyrate, cellulosics, chlorinated polyether, chlorinated rubber, epoxy ester, ethylene vinyl acetate copoloymers, maleics, melamine, natural resins, nitrocellulose solutions, isocyanates, hydrogenated resin, polyamide, polycarbonate, rosins, polyesters, polyethylene, polyolefins, polypropylene, polystyrene, polyurethane, polyvinyl acetate, silicone, vinyls, and water thinned resins. Additional suitable resins are described in the text entitled 1996 *Paint Red Book*, published by Modern Paint and Coatings Magazine, July 1995. Further, the resins may include any other materials which have suitable binding properties to bind the conductive materials and other ingredients of the second layer composition together.

The selected resins may be either water soluble or soluble in an organic solvent based system or may be 100% solids with no volatile fraction. Alternatively, the resin may be dispersible in a suitable liquid, rather than truly soluble therein. A liquid dispersion medium may be used in which the resin is dispersed, but in which other materials may be truly dissolved. The resin may be used with or without cross-linking. If cross-linking is desired, it may be obtained by using a cross-linking agent or by application of heat to the composition or by choosing a self cross-linking resin.

As stated above, the resin may be dissolved or dispersed in various liquids which serve as the vehicle for carrying the resin. The ingredients of the particular vehicle are not critical to the present invention. Thus, second composition layer 308 may be water based, or water miscible (including water dispersible), solvent based, plastisol based, UV, EB etc. Further, as also stated above, second composition layer 308 may be applied as a bulk material system which does not require any solvents.

Second composition layer 308 may optionally include selected amounts of colorant that will impart a desired color thereto. Since second composition layer 308 will often be entirely masked (i.e., hidden) by the first layer 306, it may not be necessary to include any such pigment therein. In this regard, second composition layer 308 may include a substantial amount of a colorant. As used herein, the term "colorant" is intended to include any substance that imparts color to a material. The colorant may comprise a dye or a pigment. Further, the colorant may be naturally present, admixed with a material such as dried pigments and paints, or applied in solution such as organic dyes. For the purpose of the present invention, no technical distinction will be drawn between the terms "dyes" and "pigments." Thus, those terms will be considered synonymous with each other and with the term colorant as defined herein.

The resistance of the second conductive composition layer 308 should preferably be less than or equal to 25 MΩ for each branch or trace of a circuit path, but may be higher in certain applications. As previously discussed, we have found that the resistivity of the conductive composition is preferably 5 k$\Omega$/mm$^2$. Where a lower resistivity is required, materials such as silver may be used in the conductive composition.

As further seen in FIG. 3A, the conductive composition 308 includes a gap D that forms an open circuit area along a circuit path. In terms of the electrical schematics of FIGS. 1 and 2, the gap D is represented by switches 110 and 222. Thus, where the color of the nonconductive compositions forming the first layer 306 and conductive composition forming the second layer match, the combined multi-layer composition 300 would be of a continuous design. In particular, although the gap D represents an open switch, the open switch is not apparent when viewing the object. Thus, designs made in accordance with this aspect of the present invention have the aesthetic external appearance of being a continuous layer of material in or on an object. In accordance with the present invention, the switch closes when a conductive element bridges the gap D. This conductive element may include a finger or other closure element that allows current to flow across the gap D.

Figure 3B:
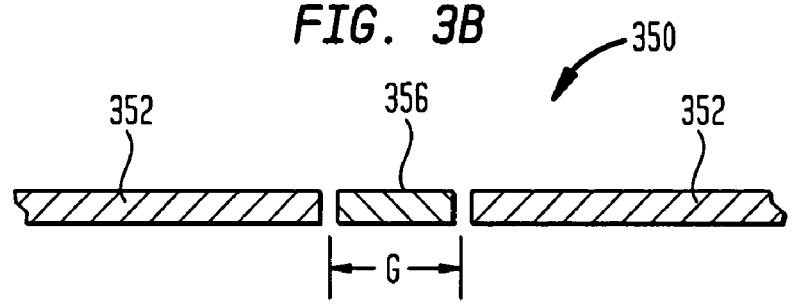
FIG. 3B is an illustrative enlarged top view of a portion of the circuit path in accordance with another aspect of the present invention.

FIG. 3B illustratively depicts a top view of an additional illustrative embodiment in accordance with another aspect of the present invention. In particular, a circuit path 350 includes a layer of conductive composition 352 that is interrupted by a gap or open circuit G. In terms of the electrical schematics of FIGS. 1 and 2, the gap G is represented by switches 110 and 222. A layer of nonconductive composition 356 is arranged within the gap G so that the appearance of a single continuous path is provided despite the presence of the gap G, which functionally operates as a switch. Thus, in accordance with this aspect of the present invention, when a conductive element, e.g., a user's finger, bridges the gap G the circuit path closes across the gap G allowing for a closed circuit condition along the circuit path.

The embodiments of FIGS. 3A and 3B allow open circuit or switches to be included in a circuit path while masking the presence of the open circuit. In some applications the masked switch may be used to advantageously enhance security. In other applications, such as discussed in relation to FIG. 6 below, the presence of the open switch may allow for more control over the interaction between a user and the circuit path comprising a circuit or electronic design.

Figure 4:
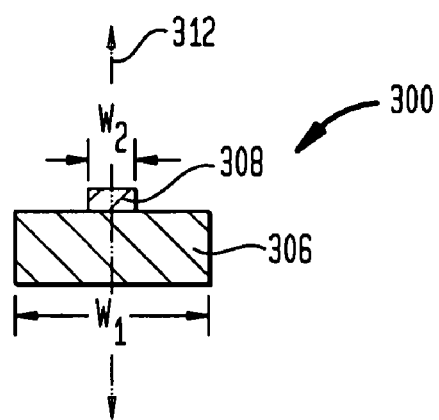
FIG. 4 is a cross sectional view along the numeral 4-4 axis of FIG. 3A.

Turning now to FIG. 4, a cross-sectional view of multilayer composition 300 is shown. Preferably, the ratio of the second width ($W_2$) of the layer 308 to the width ($W_1$) of the first layer 306 is less than or equal to 1. Therefore, even where there is a gap in the second layer 308, the design or circuit path would appear continuous. In accordance with a preferred embodiment of the present invention, a trace for a circuit path is made by first depositing the nonconductive composition along a path that comprises a design. Next, the conductive composition is then applied either on top of or next to the nonconductive composition trace with gaps at desired locations. Alternatively, where it is not suitable that two separate traces be applied to a surface as just described; the trace may be prefabricated and affixed to an object's surface using an adhesive.

Although, as depicted in FIGS. 3 and 4, the second layer appears centered on the first layer, the second layer need not be centered on the first layer. For example, the second or upper layer 308 may be placed to the left or right of transverse axis 312. In addition, although less preferred, it is possible to place the second conductive layer 308 next to the nonconductive layer 306 without sacrificing much in the way of aesthetics and functionality by having the width W2 be less than or equal about one-fourth (¼) of the width W1. It is also permissible to place the non-conductive layer on top of the conductive layer as is discussed in further detail below.

Figure 5:
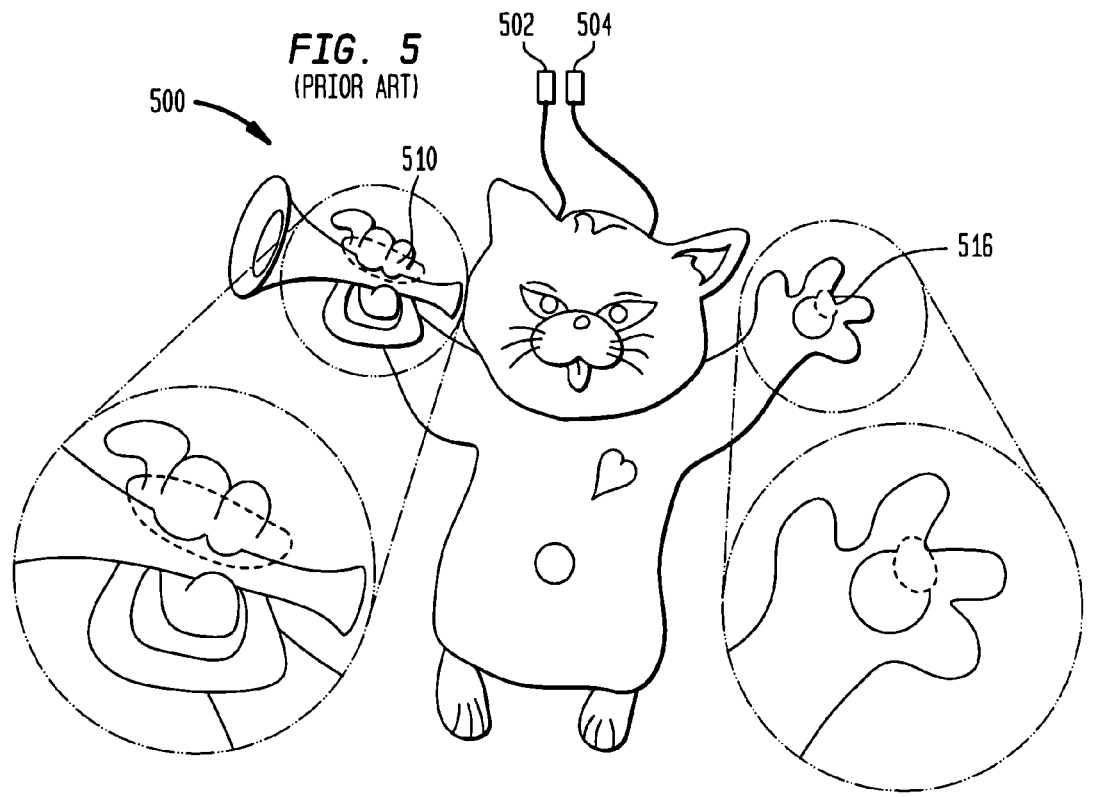
FIG. 5 illustrates a prior art design.

FIG. 5 illustrates a prior art paper design 500 wherein the switches or trigger points are evident on the design. In particular, in the design 500, a pair of contact points or nodes 502 and 504 are connectable to a power supply (not shown). The design includes a number of switch or trigger points 510 and 516 that when individually touched may produce a different sound. For example, when trigger point 510 is touched by a finger, a signal maybe fed to node 502, which is connected to a speaker, which produces audible sound, e.g., a trumpet playing. As another example, when the switch 516 is touched, "I LOVE YOU" emanates from a speaker connected via node 504. As seen in FIG. 5, each of the trigger points 512 and 516 are not of a continuous design as there is no tracing of the circuit path at the trigger points.

Figure 6:
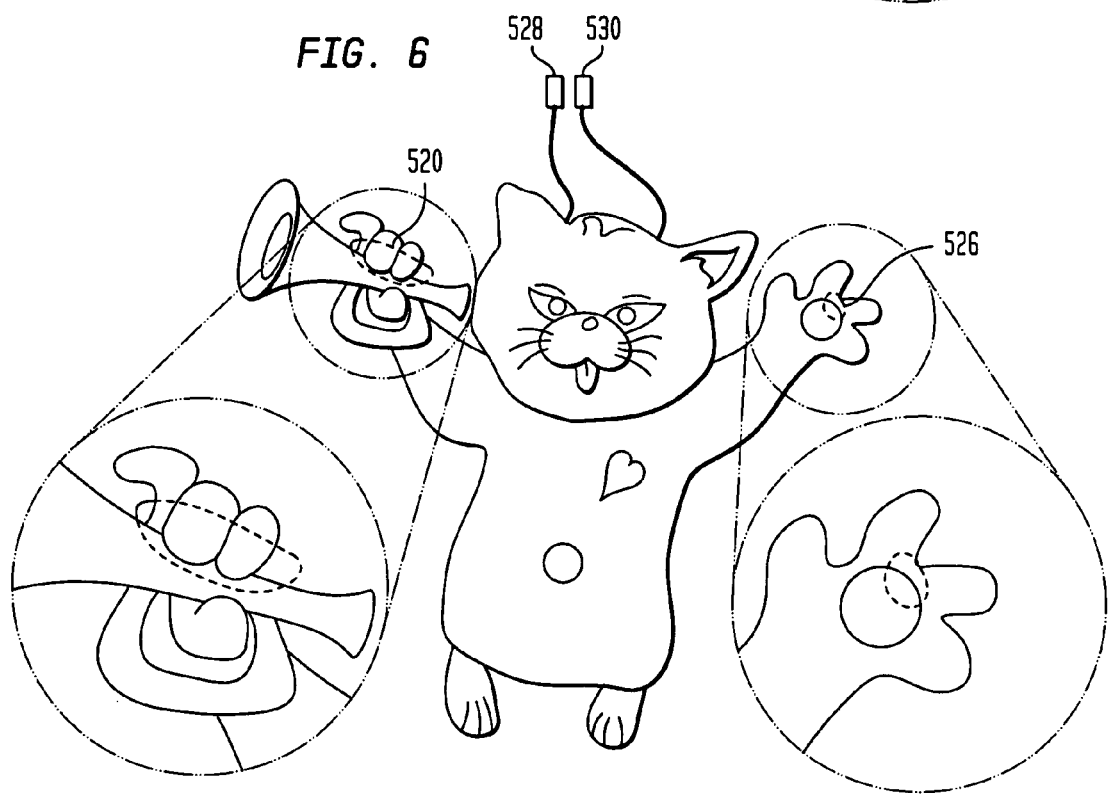
FIG. 6 illustrates a design in accordance with the present invention.

In contrast, in FIG. 6 and in accordance with this aspect of the present invention, trigger points 520 and 526 form part of the continuous pattern of the design. In accordance with the embodiment shown in FIG. 6, a nonconductive ink was first applied to the paper as is reflected in the layout of the design. With the nonconductive ink serving as a base, a layer of conductive ink was applied to the nonconductive base layer with gaps that form trigger points 520 and 526. When the design of FIG. 6 is powered at nodes 528 and 530, the design interacts when a user touches either of trigger points 520 or 526.

In accordance with a further variant, a layer of conductive ink may be first printed. A layer of non-conductive ink may then be printed on top of the layer of conductive ink yet while allowing touching of the conductive layer through the non-conductive layer. Subsequent non-conductive layers may then be printed at predetermined locations above or on top of previous layers of non-conductive compositions to form insulators at the predetermined areas. The insulators will then prevent touching of the first conductive layer at the predetermined locations. The insulators may also be used as capacitance switches. This technique may be particularly advantageous in offset printing.

Although, in FIG. 6, the invention is illustrated as being incorporated in a drawing pattern as part of a conductive ink composition, the present invention may be implemented in a like manner on clothing, automobile dashboards, toys, appliances, plastics, etc. In general, the conductive composition and non-conductive composition may be placed on any substrate and function as described herein as long as the relative difference in resistance between the conductive and non-conductive composition is approximately 1 k$\Omega$ or greater. For example, a design may be formed on an article of clothing using either the embodiment of FIG. 3A or FIG. 3B. In particular, the outline of a design, e.g., a car, may be placed on a sweatshirt using a layer of conductive ink that placed on a layer of non-conductive ink. In the design, an open circuit may be placed around a headlight by leaving a gap (e.g., circular gap) in the layer of conductive ink. Alternatively, a single layer of conductive ink may provide the outline of the car's design and the gap, e.g., the headlight, may be formed by a layer of nonconductive ink. In this way, the switches form an integral part of the design.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An electronic product comprising:
    a substrate;
    a battery;
    a substantially non-conductive composition arranged on the substrate and having a first color;
    a substantially conductive composition having a second color that matches the first color, the conductive composition being arranged on the non-conductive composition and forming an open circuit area thereon; and
    an electronic circuit element connected to the conductive composition, the electronic circuit element also being electrically connected to the battery through the conductive composition upon closing of the open circuit area.

2. The electronic product of claim 1, wherein the non-conductive composition forms a first path having a first width and the conductive composition forms a second path having a second width, the first width being at least as wide as the second width.

3. The electronic product of claim 2, wherein the first path has a width of approximately 1 mm.

4. The electronic product of claim 1, wherein the conductive and non-conductive compositions comprise ink.

5. The electronic product of claim 1, wherein the conductive composition includes a predetermined amount of silver.

6. The electronic product of claim 1, wherein the conductive composition comprises a predetermined amount of carbon.

7. An electronic product comprising:
    a substrate;
    a battery;
    a layer of substantially non-conductive ink having a predetermined color printed on the substrate; and
    a layer of conductive ink having substantially the same color as the non-conductive ink, the conductive ink being arranged on top of a portion of the non-conductive ink and being connected to the battery, the conductive ink forming at least one open circuit switch area that can be selectively closed upon contact with a conductive element.

8. The electronic product of claim 7, wherein the non-conductive ink is arranged across the at least one open circuit switch area so that the at least one open circuit switch area has a continuous visual appearance.

9. The electronic product of claim 8, wherein the non-conductive and conductive inks are printed with substantially uniform widths, the width of the non-conductive ink being at least as large as the width of the conductive ink.

10. The electronic product of claim 9, further comprising an electronic circuit element connected for electrical communication with the conductive ink and the battery.

11. The electronic product of claim 10, wherein the electronic circuit element comprises a light emitting diode.

12. The electronic product of claim 10, wherein the electronic circuit element comprises a sound module.

13. An electronic product comprising:
a substrate;
a non-conductive composition arranged on the substrate;
a conductive composition arranged on a portion of the non-conductive composition, the conductive composition forming a gap through which the non-conductive composition is visible, the conductive and non-conductive compositions having substantially the same color so that the combination of the two compositions appear to be continuous across the gap;
a circuit module connected to the conductive composition; and
a battery electrically connected to the conductive composition and the circuit module whereby the circuit module is operable when a closed circuit condition is caused by placing a conductive object across the gap of the conductive composition.

14. The electronic product of claim 13, wherein the conductive and non-conductive compositions have substantially the same width.

15. The electronic product of claim 13, wherein the conductive and non-conductive compositions comprise ink.

16. The electronic product of claim 13, wherein the non-conductive composition has a resistance of at least 100 MΩ.

* * * * *